(12) United States Patent
Shiraishi

(10) Patent No.: US 11,146,274 B1
(45) Date of Patent: Oct. 12, 2021

(54) EQUALIZER CONTROL DEVICE, RECEIVING DEVICE, AND CONTROL METHOD FOR RECEIVING DEVICE

(71) Applicant: KIOXIA CORPORATION, Tokyo (JP)

(72) Inventor: Mikio Shiraishi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/008,480

(22) Filed: Aug. 31, 2020

(30) Foreign Application Priority Data

Mar. 23, 2020 (JP) .............................. JP2020-051867

(51) Int. Cl.
| | |
|---|---|
| *H03L 7/07* | (2006.01) |
| *H03L 7/081* | (2006.01) |
| *H03L 7/10* | (2006.01) |
| *H03L 7/181* | (2006.01) |
| *H04L 25/03* | (2006.01) |

(52) U.S. Cl.
CPC .............. *H03L 7/07* (2013.01); *H03L 7/0812* (2013.01); *H03L 7/104* (2013.01); *H03L 7/181* (2013.01); *H04L 25/03885* (2013.01)

(58) Field of Classification Search
CPC ......... H03L 7/07; H03L 7/0812; H03L 7/181; H04L 25/03885
USPC .......................................... 327/156, 158, 161
See application file for complete search history.

(56) References Cited

U.S. PATENT DOCUMENTS

| | | | |
|---|---|---|---|
| 8,098,724 B2 | 1/2012 | Shumarayev et al. | |
| 8,791,735 B1 | 7/2014 | Shibasaki | |
| 10,009,194 B2 | 6/2018 | He et al. | |
| 10,038,545 B1 | 7/2018 | Wu et al. | |
| 10,050,774 B1 | 8/2018 | Azenkot et al. | |
| 10,050,814 B2 | 8/2018 | Hoshyar et al. | |
| 10,103,911 B2 | 10/2018 | Shibasaki | |
| 10,554,452 B2 | 2/2020 | Shiraishi | |
| 2007/0201545 A1 | 8/2007 | Zamir et al. | |
| 2017/0317859 A1* | 11/2017 | Hormati | ............ H04L 25/03057 |

FOREIGN PATENT DOCUMENTS

| | | |
|---|---|---|
| JP | 5540472 B2 | 7/2014 |
| JP | 6079888 B2 | 2/2017 |
| JP | 6569338 B2 | 9/2019 |
| WO | 2010039232 A2 | 4/2010 |

\* cited by examiner

*Primary Examiner* — John W Poos
(74) *Attorney, Agent, or Firm* — Kim & Stewart LLP

(57) ABSTRACT

An equalizer control device includes a first circuit configured to, upon receipt of a data signal that has been equalized by a continuous time linear equalizer (CTLE) circuit, output a first signal related to a first number of times a waveform of the data signal crosses a threshold value or differential signals of the data signal cross each other. A second circuit is configured to count the first number during a particular time period based on the output first signal, and select one of equalization parameters to be set to the CTLE circuit based on the counted first number.

20 Claims, 14 Drawing Sheets

FIG. 8

| INPUT | OUTPUT |
|---|---|
| p | e |
| 00 | 0001 |
| 01 | 0010 |
| 10 | 0100 |
| 11 | 1000 |

EQUALIZER CONTROL DEVICE, RECEIVING DEVICE, AND CONTROL METHOD FOR RECEIVING DEVICE

CROSS-REFERENCE TO RELATED APPLICATION(S)

This application is based upon and claims the benefit of priority from Japanese Patent Application No. 2020-051867, filed Mar. 23, 2020, the entire contents of which are incorporated herein by reference.

FIELD

Embodiments described herein relate generally to an equalizer control device, a receiving device, and a control method.

BACKGROUND

In the related art, in a field of wired data communication, there has been proposed a technique for preventing decrease in a communication speed and deterioration in communication quality due to skew between bits of data and skew between data and a clock. For example, there is a technique of transmitting data in which a clock to be synchronized with the data is embedded by a transmitting device, and then reproducing the embedded clock from received data at a receiving device. The receiving device samples and digitizes the received data in synchronization with the reproduced clock. A circuit that reproduces the clock from the received data in the receiving device is called a clock and data recovery (CDR) circuit. In such a situation, a waveform equalization circuit is used in the receiving device to correct waveform distortion due to a loss in a transmission line that connects the transmitting and receiving devices.

Examples of the waveform equalization circuit include a continuous time linear equalizer (CTLE) and a decision feedback equalizer (DFE). The CTLE and the DFE are disposed between a receiving end of the receiving device and the CDR circuit. The CTLE is an analog circuit having a frequency characteristic of emphasizing a high band or attenuating a low band, and compensates for the frequency characteristically lost in the transmission line so as to be close to flat. The DFE includes cascade-connected delay elements and coefficient (tap coefficient) circuits respectively corresponding to output signals of the delay elements, and further equalizes the signal after being compensated by the CTLE.

When the CTLE appropriately compensates the frequency characteristic, data can be restored from an output of the CTLE without operation of the DFE. However, a length of the transmission line between the transmitting and receiving devices may be unknown or may be changed by a user. In such a case, it is difficult to set an appropriate compensation amount in the CTLE in advance. A case where the high band emphasis by the CTLE is insufficient is referred to as under equalization and a case where the emphasis is excessive is referred to as over equalization.

In general, communication is started with equalization parameters for the CTLE that cause over equalization. Thereafter, the parameters of the CTLE are appropriately readjusted. In order to perform the adjustment after the communication is started, a method of measuring a size of an opening in an eye diagram (hereinafter, referred to as an eye opening) may be used.

In the measurement of the eye opening, the CDR circuit needs to be locked in a state in which the clock can be appropriately reproduced from an input signal. The eye diagram is obtained by overlaying signal waveforms in a range of one clock cycle over a plurality of cycles of the clock. Therefore, when a cycle of a synchronous clock of the data transmitted by the transmitting device, that is, a bit cycle (also referred to as a unit interval or a UI), is not known, the eye diagram cannot be drawn. That is, when the CDR circuit cannot reproduce the clock, the eye diagram cannot be drawn.

However, when the CTLE is over-equalized, the CDR circuit may not be locked due to an influence of time variation of the bit cycle, that is, jitter.

BRIEF DESCRIPTION OF THE DRAWINGS

FIG. 8 is a diagram of an input and output correspondence relationship (truth table) of a decoder.

DETAILED DESCRIPTION

Embodiments provide an equalizer control device, a receiving device, and a control method of receiving device that are capable of adjusting a frequency characteristic of a CTLE even when a CDR circuit is not yet locked.

In general, according to one embodiment, an equalizer control device includes a first circuit configured to, upon receipt of a data signal that has been equalized by a continuous time linear equalizer (CTLE) circuit, output a first signal related to a first number of times a waveform of the data signal crosses a threshold value or differential signals of the data signal cross each other. A second circuit is configured to count the first number during a particular time period based on the output first signal, and select one of equalization parameters to be set to the CTLE circuit based on the counted first number.

Certain example embodiments will be described with reference to the drawings. The present disclosure is not limited to the drawings and description of these example embodiments.

Figure 1:
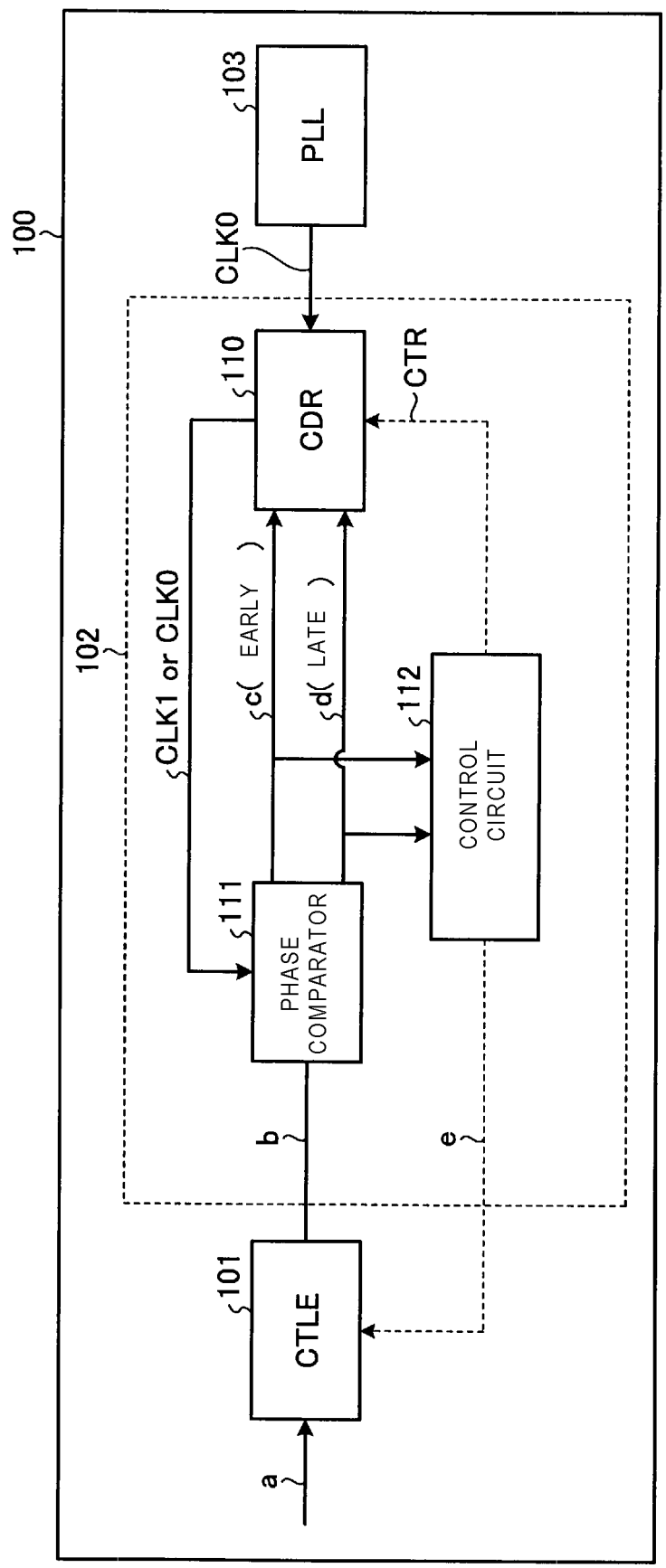
FIG. 1 is a schematic diagram of a receiving device according to a first embodiment.

FIG. 1 is a schematic diagram of a receiving device 100 according to an embodiment. The receiving device 100 includes a CTLE circuit 101, an equalizer control unit 102, and a phase lock loop (PLL) circuit 103. The equalizer control unit 102 includes a CDR circuit 110, a phase comparator 111, and a control circuit 112.

In the above-mentioned configuration, the CTLE circuit 101 receives a data signal "a" that have been transmitted through a transmission line and a control signal "e", applies waveform equalization based on a frequency characteristic selected by the control signal "e" to the data signal "a", and outputs an equalized signal "b" as an output signal.

The phase comparator 111 detects a rising timing and a falling timing of the equalized signal "b" input from the CTLE circuit 101 based on a clock signal CLK1 or a clock signal CLK0 sent from the CDR circuit 110. The phase comparator 111 outputs, to the CDR circuit 110 and the control circuit 112, an early signal "c" when detecting a phase state in which the input clock signal CLK1 or the input clock signal CLK0 is ahead of the equalized signal "b", and a late signal "d" when detecting a phase state in which the input clock signal CLK1 or the input clock signal CLK0 is behind the equalized signal "b".

The CDR circuit 110 comes into a locked state or a non-locked state according to the clock signal CLK0 input from the PLL circuit 103, and the early signal "c" and the late signal "d" that are input from the phase comparator 111. The CDR circuit 110 outputs the clock signal CLK1 or the clock signal CLK0 to the phase comparator 111 according to a control signal CTR input from the control circuit 112.

In the non-locked state, the CDR circuit 110 outputs the input clock signal CLK0 to the phase comparator 111 regardless of states of the early signal "c" and the late signal "d". In the locked state, the CDR circuit 110 performs phase adjustment based on the early signal "c", the late signal "d", and the input clock signal CLK0 to generate the clock signal CLK1 synchronized with the data signal "a", and outputs the clock signal CLK1 to the phase comparator 111.

The control circuit 112 generates the control signal CTR based on the early signal "c" and the late signal "d" that are input from the phase comparator 111 and outputs the control signal CTR to the CDR circuit 110. The control signal CTR is a signal for controlling whether the clock signal CLK1 or the clock signal CLK0 is output by the CDR circuit 110. The control circuit 112 performs a process of determining the control signal "e" for selecting a frequency characteristic more suitable for the CDR circuit 110 to come into the locked state, based on the input early signal "c" and the input late signal "d". The control circuit 112 outputs the control signal "e" determined by this process to the CTLE circuit 101. The CTLE circuit 101 outputs, based on the input control signal "e", the equalized signal "b" obtained by applying the waveform equalization based on the estimated frequency characteristic to the data signal "a". As a result, the CDR circuit 110 can shift to the locked state based on the early signal "c" and the late signal "d" that are output from the phase comparator 111.

Figure 2:
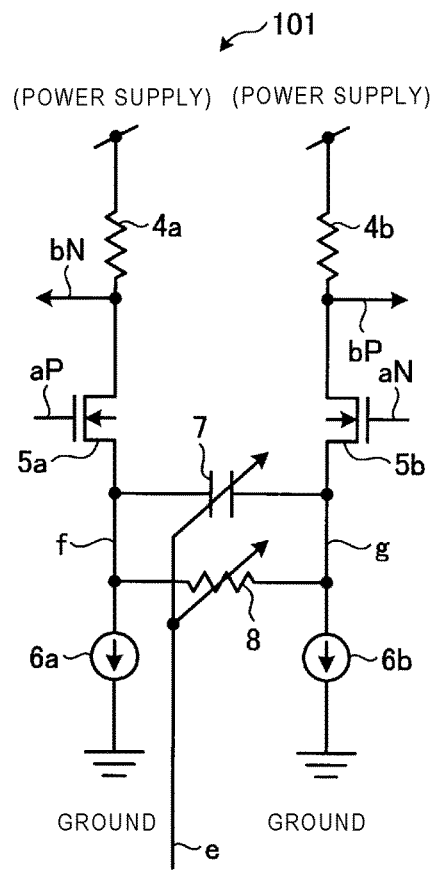
FIG. 2 is a diagram of an example of a CTLE circuit.

FIG. 2 is a diagram of an example of the CTLE circuit 101. The CTLE circuit 101 has a function of a differential amplifier. The CTLE circuit 101 receives a differential data signal "a" (aP and aN) and outputs the differential equalized signal "b" (bP and bN). The CTLE circuit 101 performs the waveform equalization based on the frequency characteristic corresponding to the control signal "e".

The CTLE circuit 101 includes a resistor 4a, an N-channel MOS transistor 5a, and a constant current source 6a. The resistor 4a includes one end connected to a power supply and the other end connected to the N-channel MOS transistor 5a. The N-channel MOS transistor 5a includes a drain terminal connected to the other end of the resistor 4a, a gate terminal to which the data signal aP is input, and a source terminal. The constant current source 6a includes one end connected to the source terminal of the N-channel MOS transistor 5a and the other end connected to a ground potential electrode.

The CTLE circuit 101 includes a resistor 4b, an N-channel MOS transistor 5b, and a constant current source 6b. The resistor 4b includes one end connected to the power supply and the other end connected to the N-channel MOS transistor 5b. The N-channel MOS transistor 5b includes a drain terminal connected to the other end of the resistor 4b, a gate terminal to which the inverted data signal aN is input, and a source terminal. The constant current source 6b includes one end connected to the source terminal of the N-channel MOS transistor 5b and the other end connected to the ground potential electrode.

The CTLE circuit 101 includes a variable capacitor 7 and a variable resistor 8. The variable capacitor 7 includes one end connected to an intermediate node f connected to the N-channel MOS transistor 5a and the constant current source 6a, and the other end connected to an intermediate node g connected to the N-channel MOS transistor 5b and the constant current source 6b. The variable capacitor 7 has a variable capacitance value based on the control signal "e". The variable resistor 8 is connected in parallel with the variable capacitor 7, and has a variable resistance value based on the control signal "e".

In the above-mentioned configuration, a connection point between the resistor 4a and the N-channel MOS transistor 5a functions as an inverted output terminal, and outputs the inverted equalized signal bN. Similarly, a connection point between the resistor 4b and the N-channel MOS transistor 5b functions as an output terminal, and outputs the equalized signal bP.

The CTLE circuit 101 having such a configuration boosts a high frequency component attenuated in the transmission line in an analog manner by setting the capacitance value of the variable capacitor 7 and the resistance value of the variable resistor 8 according to the control signal "e".

The variable capacitor 7 has lower impedance for the high frequency component than a low frequency component of an input signal. Therefore, a value of a current flowing through each of the N-channel MOS transistor 5a and the N-channel MOS transistor 5b increases (for example, doubles) in the high frequency component relative to the low frequency component, so that the high frequency component is boosted in the analog manner.

Figure 3:
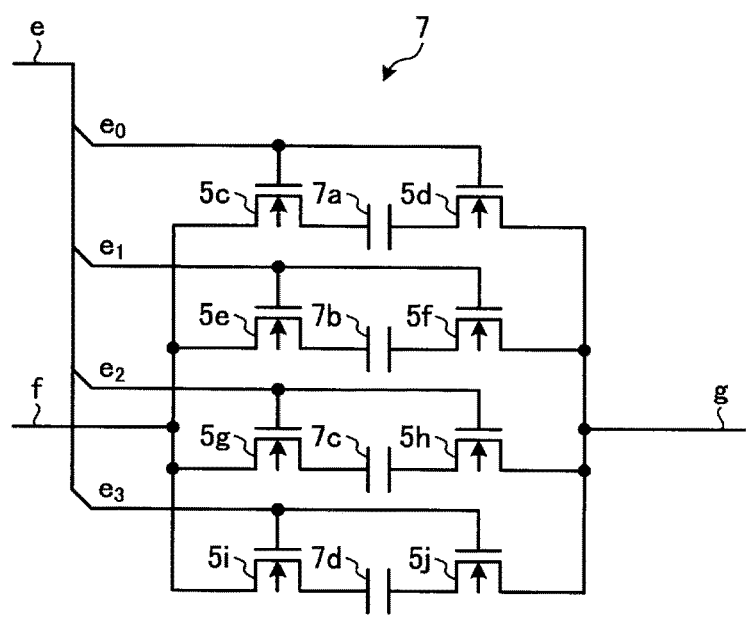
FIG. 3 is a diagram of an example of a variable capacitor.

FIG. 3 is a diagram of an example of the variable capacitor 7. In the following description, the CTLE circuit 101 that has four selectable types of frequency characteristics will be described. However, the CTLE circuit 101 may have n or more selectable types of frequency characteristics (n is 2, 3, 5 or greater), for example, ten types.

In the present example, the control signal "e" is, for example, a 4-bit signal. The 4 bits are represented by bits e0 to e3, and the bits e0 to e3 become an "H" level exclusively. That is, the control signal "e" is represented by "0001", "0010", "0100", or "1000". The control signal "e" may represent the four types of frequency characteristics with 2 bits instead of 4 bits. In such a case, the control signal "e" is represented by "00", "01", "10", or "11".

As shown in FIG. 3, between the intermediate node f and the intermediate node g, a signal line corresponding to the bit e0 is connected to a circuit in which an N-channel MOS transistor 5c, a capacitor 7a having a first capacitance, and an N-channel MOS transistor 5d are connected in series.

Similarly, between the intermediate node f and the intermediate node g, a signal line corresponding to the bit e1 is connected to a circuit in which an N-channel MOS transistor 5e, a capacitor 7b having a second capacitance, and an N-channel MOS transistor 5f are connected in series, a signal line corresponding to the bit e2 is connected to a circuit in which an N-channel MOS transistor 5g, a capacitor 7c having a third capacitance, and an N-channel MOS transistor 5h are connected in series, and a signal line corresponding to the bit e3 is connected to a circuit in which an N-channel MOS transistor 5i, a capacitor 7d having a fourth capacitance, and an N-channel MOS transistor 5j are connected in series.

Herein, the respective first to fourth capacitances of the capacitors 7a to 7d are set to different values.

The circuit connected to the signal line corresponding to any one of the bits that becomes the "H" level among the bits e0 to e3 representing the control signal "e" is exclusively connected between the intermediate node f and the intermediate node g. Accordingly, any one of the capacitors 7a to 7d is connected between the intermediate node f and the intermediate node g, and the capacitance of the variable capacitor 7 can be effectively changed.

In the above description, the circuit (including any one of the capacitors 7a to 7d) connected to any one of the signal lines corresponding to the respective bits e0 to e3 is exclusively connected between the intermediate node f and the intermediate node g. However, capacitors having the same capacitance value may be arranged in parallel so as to be selectable by the bits e0 to e3 that become the "H" level in parallel, so that the capacitance of the variable capacitor 7 can be effectively changed by a combined capacitance of the selected capacitors.

Figure 4:
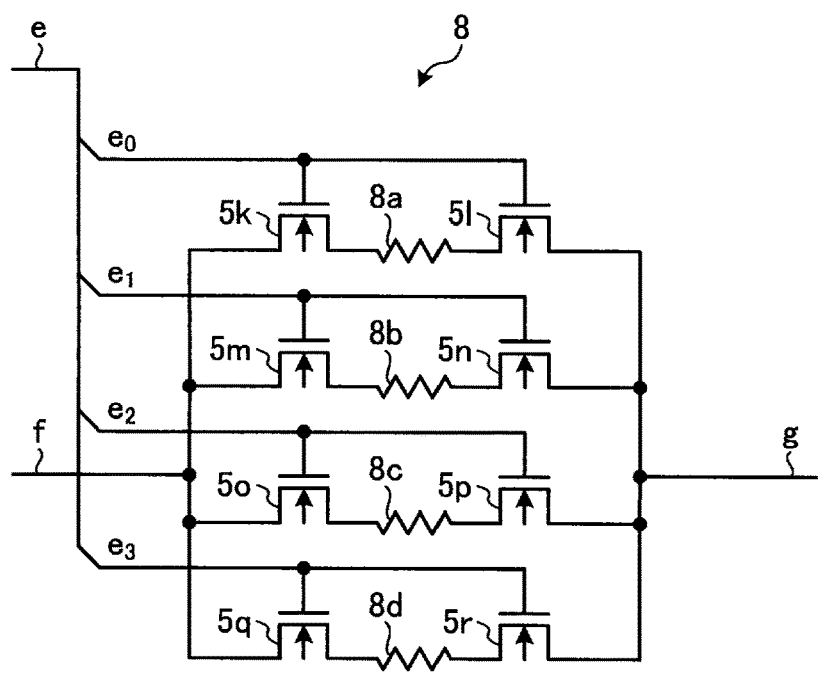
FIG. 4 is a diagram of an example of a variable resistor.

FIG. 4 is a diagram of an example of the variable resistor 8. As shown in FIG. 4, between the intermediate node f and the intermediate node g, the signal line corresponding to the bit e0 is connected to a circuit in which an N-channel MOS transistor 5k, a resistor 8a having a first resistance value, and an N-channel MOS transistor 5l are connected in series. Similarly, between the intermediate node f and the intermediate node g, the signal line corresponding to the bit e1 is connected to a circuit in which an N-channel MOS transistor 5m, a resistor 8b having a second resistance value, and an N-channel MOS transistor 5n are connected in series, the signal line corresponding to the bit e2 is connected to a circuit in which an N-channel MOS transistor 5o, a resistor 8c having a third resistance value, and an N-channel MOS transistor 5p are connected in series, and the signal line corresponding to the bit e3 is connected to a circuit in which an N-channel MOS transistor 5q, a resistor 8d having a fourth resistance value, and an N-channel MOS transistor 5r are connected in series.

Herein, the respective first to fourth resistance values of the resistors 8a to 8d are set to different values.

The circuits each connected to a signal line corresponding to any one of the bits that becomes the "H" level among the bits e0 to e3 representing the control signal "e" are exclusively connected between the intermediate node f and the intermediate node g.

Accordingly, any one of the resistors 8a to 8d is connected between the intermediate node f and the intermediate node g, and the resistance value of the variable resistor 8 can be effectively changed.

In the above description, the circuit (including any one of the resistors 8a to 8d) connected to any one of the signal lines corresponding to the respective bits e0 to e3 is exclusively connected between the intermediate node f and the intermediate node g is described. However, resistors having the same resistance value may be arranged in parallel so as to be selectable by the bits e0 to e3 that become the "H" level in parallel, so that the resistance value of the variable resistor 8 can be effectively changed by a combined resistance value of the selected resistors.

Figure 5:
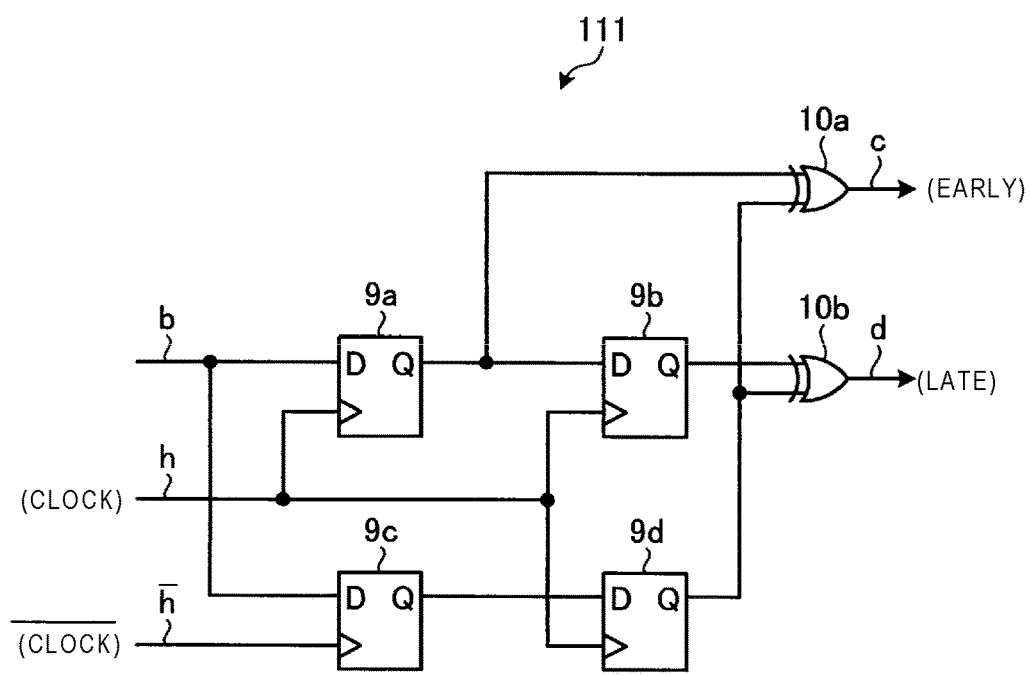
FIG. 5 is a diagram of an example of a phase comparator.

FIG. 5 is a diagram of an example of the phase comparator 111.

The phase comparator 111 includes registers 9a to 9d implemented by D flip-flops, and exclusive OR (EXOR) circuits 10a and 10b.

The register 9a includes a D terminal (input terminal) to which the equalized signal "b" is input, a clock terminal to which a clock h is input, and a Q terminal (output terminal). The register 9a acquires the equalized signal "b" at a timing of the clock h, and outputs an output signal of a level (logical value) of the acquired equalized signal "b" from the Q terminal (output terminal) to a D terminal of the register 9b and one input terminal of the exclusive OR circuit 10a.

The register 9b includes the D terminal (input terminal) to which the output signal of the register 9a is input, a clock terminal to which the clock h is input, and a Q terminal (output terminal). The register 9b acquires the output signal of the register 9a at the timing of the clock h, and outputs an output signal of a level (logical value) of the acquired output signal of the register 9a from the Q terminal (output terminal) to one input terminal of the exclusive OR circuit 10b.

The register 9c includes a D terminal (input terminal) to which the equalized signal "b" is input, a clock terminal to which an inverted clock h is input, and a Q terminal (output terminal). The register 9c acquires the equalized signal "b" at a timing of the inverted clock signal "h", and outputs the output signal of the level (logical value) of the acquired equalized signal "b" from the Q terminal (output terminal) to a D terminal of the register 9d.

The register 9d includes the D terminal (input terminal) to which the output signal of the register 9c is input, a clock terminal to which the clock h is input, and a Q terminal (output terminal). The register 9d acquires the output signal of the register 9c at the timing of the clock h, and outputs an output signal of a level (logical value) of the acquired output signal of the register 9c from the Q terminal (output terminal) to the other input terminal of each of the exclusive OR circuits 10a and 10b.

The exclusive OR circuit 10a receives the output signal of the register 9a at one input terminal and receives the output signal of the register 9d at the other input terminal. The exclusive OR circuit 10a calculates an exclusive OR of the output signal of the register 9a and the output signal of the register 9d, and outputs a calculation result as the early signal "c" from the output terminal.

The exclusive OR circuit 10b receives the output signal of the register 9b at one input terminal and receives the output signal of the register 9d at the other input terminal. The exclusive OR circuit 10b calculates an exclusive OR of the output signal of the register 9b and the output signal of the register 9d, and outputs a calculation result as the late signal "d" from the output terminal.

With these configurations, as shown in FIG. 1, the phase comparator 111 including the exclusive OR circuit 10a and the exclusive OR circuit 10b outputs the early signal "c" and the late signal "d" to the CDR circuit 110 and the control circuit 112.

As described above, the early signal "c" and the late signal "d" are each indicated by a signal indicating whether a central sample value of three successive sampling results obtained by sampling a differential amplitude waveform of the output signal of the CTLE circuit 101 (equalized signal "b") at a frequency twice the clock h is different from either one of sample values before and after the central sample value. As a result, when the central sample value is different from the sample value before, the late signal "d" becomes the "H" level. When the central sample value is different from the sample value after, the early signal "c" becomes the "H" level.

The number of intersections is obtained by cumulatively adding the numbers of the early signals "c" and the late signals "d" based on the plurality of sampling results. The number of intersections is the number of times the differential amplitude waveform of the output of the CTLE circuit 101 intersects a threshold value for identifying the "H" level and an "L" level during a cumulative addition period, or is the number of times two differential signals in differential amplification intersect each other. The higher the number of intersections, the more likely the "H" level and the "L" level are correctly identified.

Figure 6:
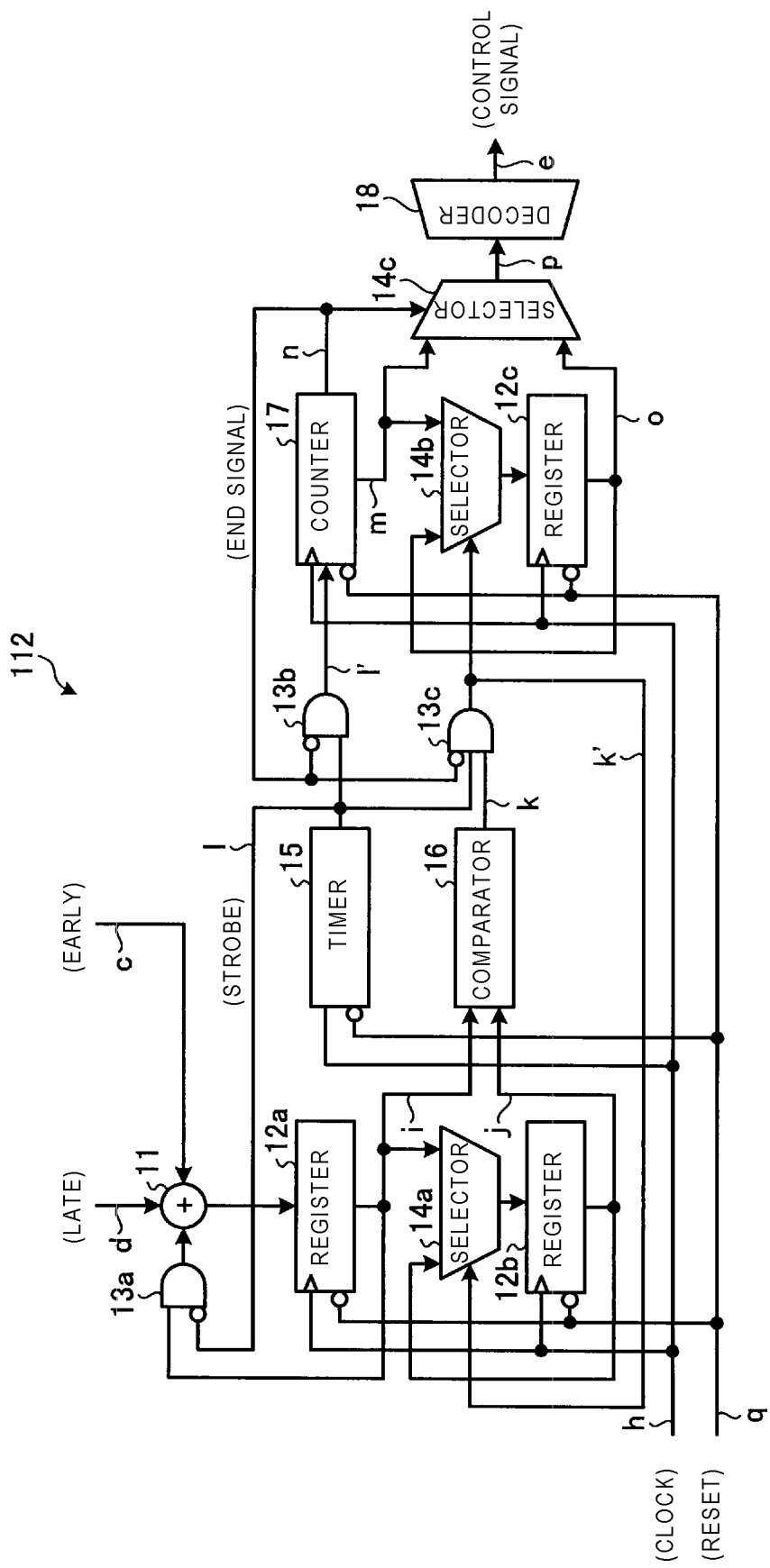
FIG. 6 is a diagram of an example of a control circuit.

FIG. 6 is a diagram of an example of the control circuit 112. The control circuit 112 includes an adder 11, registers 12a to 12c, AND circuits 13a to 13c, selectors 14a to 14c, a timer 15, a comparator 16, a counter 17, and a decoder 18.

When a reset signal "q" is the "L" level, output signals of the registers 12a to 12c, the timer 15, and the counter 17 are all reset to 0. When the reset signal "q" rises from the "L" level to the "H" level, the timer 15 asserts and maintains a strobe signal "l" at the "H" level for one cycle of the clock h at a constant cycle.

The register 12a successively stores values of the early signal "c" and the late signal "d" cumulatively added by the adder 11 during one cycle of the strobe signal "l". When the strobe signal "l" is the "H" level and an end signal "n" is the "L" level, an output signal "k" of the comparator 16 is transmitted to the selectors 14a and 14b as a selector selection signal k' through the AND circuit 13c.

The comparator 16 compares an output signal "i" of the register 12a with an output signal "j" of the register 12b. If i>j, the comparator output signal "k" is set to the "H" level, and if not, the comparator output signal "k" is set to the "L" level.

The selector 14a selects the output signal "i" of the register 12a when the selector selection signal k' output from the AND circuit 13c is the "H" level, selects the output signal "j" of the register 12b when the selector selection signal k' is the "L" level, and outputs the selected output signal to the register 12b.

The selector 14b selects an output (count value) "m" of the counter 17 when the selector selection signal k' output from the AND circuit 13c is the "H" level, selects an output value "o" of the register 12c when the selector selection signal k' is the "L" level, and outputs the selected value to the register 12c.

The strobe signal "l" is transmitted to the counter 17 as an output signal l' of the AND circuit 13b via the AND circuit 13b when the end signal "n" is the "L" level.

The counter 17 increments the count value "m" while the output signal l' is the "H" level. When the count value "m" reaches a maximum value, the end signal "n" is raised to the "H" level.

The end signal "n" is input to the selector 14c and the AND circuits 13b and 13c. The selector 14c selects the output signal "m" of the counter 17 when the end signal "n" is the "L" level, selects the output value "o" of the register 12c when the end signal "n" is the "H" level, and outputs the selected value to the decoder 18.

The AND circuit 13b sets the output signal l' thereof to the "L" level when the end signal "n" becomes the "H" level. Accordingly, the counter 17 stops operating, fixes a value of the count value "m", and sets the end signal "n" to the "H" level. Thereafter, the end signal "n" is maintained at the "H" level.

The AND circuit 13c sets the output signal (selector selection signal) k' thereof to the "L" level when the end signal "n" becomes the "H" level. Accordingly, the selector 14a selects the output of the register 12b, and the selector 14b selects the output of the register 12c. Therefore, the outputs of the registers 12b and 12c do not change after the end signal "n" is asserted (becomes the "H" level).

The decoder 18 uses an output value "p" of the selector 14c as an input value, decodes the input value according to an explanatory diagram of an input and output correspondence relationship (truth table: see FIG. 8) to be described later, and outputs the control signal "e".

Figure 7:
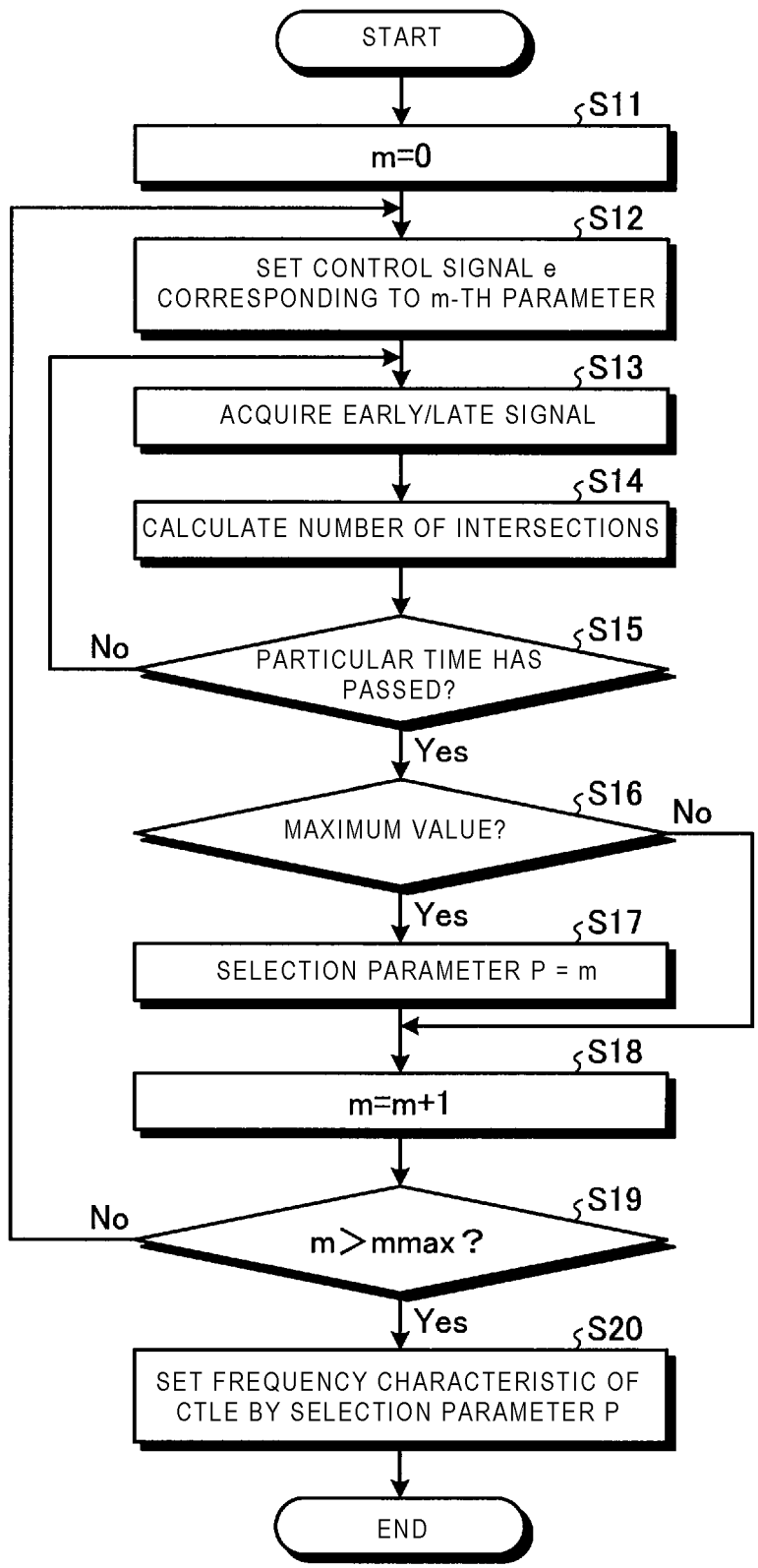
FIG. 7 is a flowchart of operations of the control circuit.

FIG. 7 is a flowchart showing operations of the control circuit 112. Herein, the operations of the control circuit 112 will be described with reference to FIGS. 6 and 7.

The control circuit 112 first sets the count value "m" that determines a parameter for specifying a selectable frequency characteristic to 0 which is an initial value.

Herein, since four types of selectable frequency characteristics are present, the maximum value of m is 3. (S11).

The value of the count value "m" is an output value of the counter 17. That is, an initial output value of the counter 17 is 0. An initial output value "o" of the register 12c is also 0.

Accordingly, the selector 14c of the control circuit 112 outputs a 2-bit initial output value "p"="00" to the decoder 18 as an m-th parameter.

FIG. 8 is a diagram of the input and output correspondence relationship (truth table) of the decoder 18.

In FIG. 8, values of the control signal "e" are represented by e3, e2, e1, and e0 in order from the leftmost bit (Most Significant Bit (MSB)), respectively. For example, the control signal "e"="0010" is represented by e3=0, e2=0, e1=1, and e0=0, that is, e3="L", e2="L", e1="H", and e0="L" in the signal level.

As shown in FIG. 7, the decoder 18 to which the output value "p" is input outputs the control signal "e" corresponding to the m-th parameter (S12).

Specifically, in an initial state, since the initial output value "p"="00", the decoder 18 outputs the control signal "e"="0001" as the initial output value.

Accordingly, the CTLE circuit 101 starts equalizing with the frequency characteristic corresponding to the control signal "e". The CTLE circuit 101 outputs the equalized signal "b" to the phase comparator 111 of the equalizer control unit 102.

The phase comparator 111 generates the early signal "c" and the late signal "d" based on the input equalized signal "b", and outputs the early signal "c" and the late signal d to the CDR circuit 110 and the control circuit 112.

The control circuit 112 acquires the early signal "c" and the late signal "d" (S13), and calculates the number of intersections during a particular time set in the timer 15 (S14).

Specifically, in the control circuit 112, the adder 11 adds the input early signal "c" and the input late signal "d", and adds the output signal "i" of the register 12a input via the AND circuit 13a, that is, a cumulative addition value (initial value=0) of the early signal "c" and the late signal "d" up to a previous time. The adder 11 outputs an addition result to the register 12a to update the register 12a.

In parallel with this, the comparator 16 outputs, to the AND circuit 13c, the comparison signal "k" for selecting a register having a larger value, which is a result of the comparison between the output signal "i" of the register 12a and the output signal "j" (initial value=0) of the register 12b.

The AND circuit 13c outputs, to the selector 14a and the selector 14b, the selector selection signal k' that is a result of AND calculation of an inverted signal of the end signal "n" from the counter 17, the strobe signal "l" of the timer 15, and the comparison signal "k".

As a result, the selector 14a outputs an output value having a larger value of the output signal "i" of the register 12a and the output signal "j" of the register 12b to the register 12b and updates the register 12b.

These processes (S13, S14) are repeated until the particular time is passed (S15; No). The particular time is measured by the timer 15.

When the particular time is passed (S15; Yes), the comparator 16 determines whether the output signal "i" of the register 12a is larger than the output signal "j" of the register 12b, that is, whether the cumulative addition value is the maximum value at the present time (S16). Further, when the cumulative addition value is the maximum value at the present time (S16; Yes), the register 12b is updated with the output signal "i" of the register 12a. Accordingly, since the output signal (comparison signal) "k" of the comparator 16 is the "H" level, the selector selection signal k' of the AND circuit 13c is the "H" level. The selector 14b uses the current count value "m" from the counter 17 to update the previous count value "m" stored in the register 12c at the timing when the selector selection signal k' is previously set to the "H" level.

That is, the count value "m" when the cumulative addition value of the early signal "c" and the late signal "d" has the largest value (maximum value), that is, the count value "m" corresponding to the control signal "e" of the frequency characteristic when the cumulative addition value of the early signal "c" and the late signal "d" has the largest value is stored in the register 12c as a selection parameter P (S17).

Therefore, finally, the count value "m" corresponding to the control signal "e" that selects the frequency characteristic that is considered to be the most suitable for locking the CDR circuit 110 is stored in the register 12c.

When the cumulative addition value is not the maximum value (S16; No), or when the selection parameter P is updated by the count value "m", the counter 17 adds 1 to the count value "m" and updates the count value "m" (S18), and determines whether the count value "m" exceeds the maximum value mmax (herein, 3) of m (S19).

When the count value "m" does not exceed the maximum value mmax (herein, 3) (S19; No), the process returns to step (S12) again, and the above-described processes (S12 to S18) are repeated.

When the count value "m" exceeds the maximum value mmax (herein, 3) (S19; Yes), the counter 17 ends the count, and the end signal "n" is the "H" level. Accordingly, the selector 14c is switched to the register 12c side, and outputs the count value "m" corresponding to the control signal "e" that selects the frequency characteristic that is considered to be the most suitable for locking the CDR circuit 110 to the decoder 18 as an output signal "p" corresponding to the selection parameter P (S20). Then, the process ends.

By performing the above operations, the control circuit 112 sequentially scans and outputs the values of the control signal "e" from a top of the explanatory diagram of the input and output correspondence relationship (truth table) of the decoder of FIG. 8 until the end signal "n" rises. Then, after the end signal "n" rises, the maximum number of zero intersections is stored in the register 12b, and a count value "m" corresponding to the maximum number of zero intersections is stored in the register 12c. Therefore, the control signal "e" that maximizes the number of intersections is output from the control circuit 112.

When a plurality of values of the control signal "e" having the largest number of intersections are present, one that is earliest in the scan order is selected and output. For example, when the values of the control signal "e" are scanned in the order shown in FIG. 8 and when the numbers of intersections are equally maximum between the values of the control signals "e" of "0010" and "0100", e="0010" is selected.

Next, a timing chart showing the operations of the control circuit in a time series will be described with reference to FIG. 9.

Figure 9:
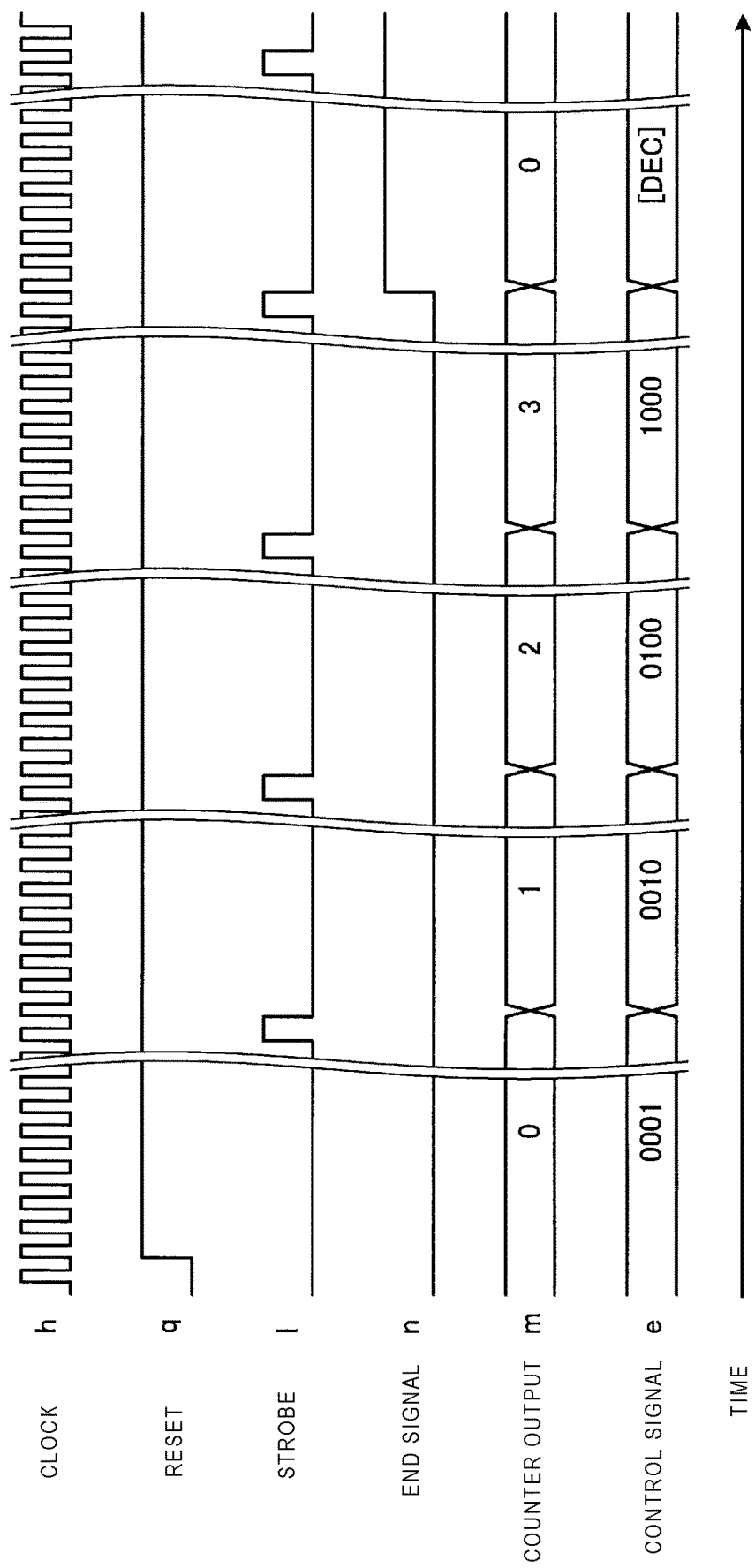
FIG. 9 is a timing chart showing operations of the control circuit.

FIG. 9 is the timing chart showing the operations of the control circuit 112.

As shown in FIG. 9, when the reset signal "q" becomes the "H" level in a state in which the clock h is input while the end signal "n" is at the "L" level, the count value "m" of the counter 17 is "0", and the control signal "e" is "0001".

Thereafter, when the strobe signal "l" is set to the "H" level by the timer 15, the count value "m" is "1" and the control signal "e" is "0010".

Further, when the strobe signal "l" is again set to the "H" level by the timer 15, the count value "m" is "2" and the control signal "e" is "0100".

Further, when the strobe signal "l" is set to the "H" level by the timer 15, the count value "m" is "3" and the control signal "e" is "1000".

Next, when the end signal "n" is "H" level by the counter 17, the selector 14c selects the output value "o" of the register 12c, outputs the count value "m" corresponding to the control signal "e" for selecting the frequency characteristic that is considered to be the most suitable for locking the CDR circuit 110 as a set decoder value DEC, and shifts to lock control of the CDR circuit 110.

Figure 10:
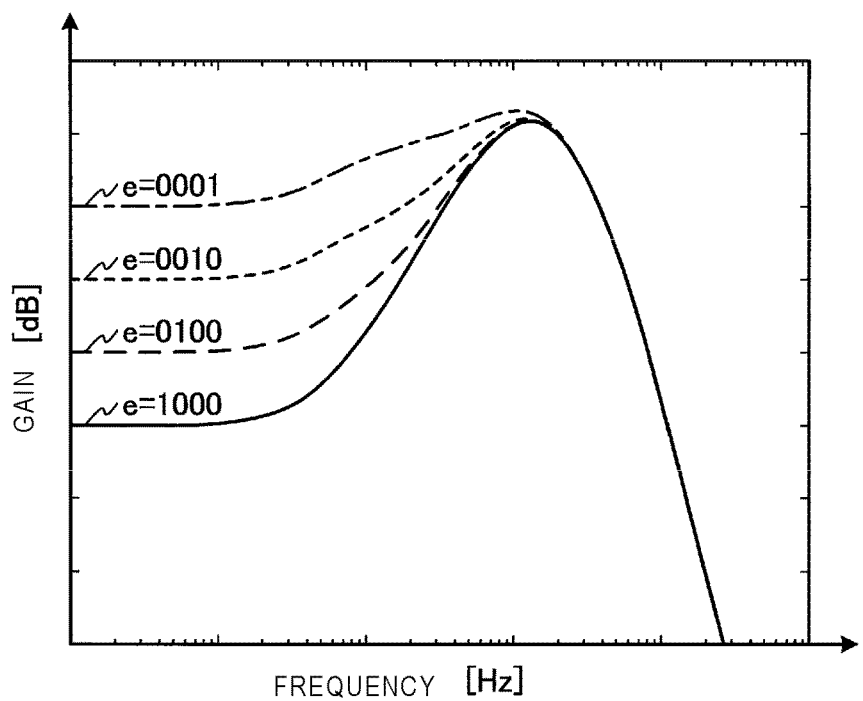
FIG. 10 is a diagram showing a frequency characteristic of the CTLE circuit.

FIG. 10 is a diagram showing the frequency characteristic of the CTLE circuit 101.

As shown in FIG. 10, the frequency characteristic of the CTLE circuit 101 is changed according to the value of the control signal "e". When the control signal "e" is changed in the order shown in FIG. 9, the frequency characteristic of the CTLE circuit 101 changes from a state in which a low band attenuation amount is small to a state in which the low band attenuation amount is large.

Therefore, when the end signal "n" rises to the "H" level, when a plurality of values of the control signal "e" that maximizes the number of intersections are present, since the control signal "e" that is earliest in the scan order is selected, the CTLE circuit 101 is adjusted to a frequency characteristic that maximizes the number of intersections and has the lowest low band attenuation amount.

Figure 11:
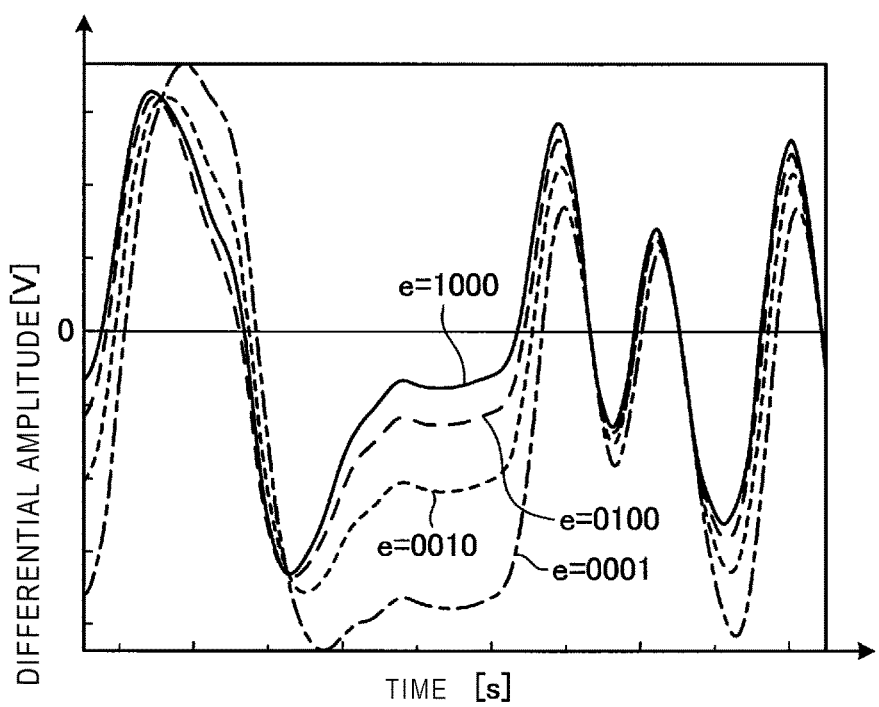
FIG. 11 is a diagram showing a differential amplitude of an equalized signal with respect to data that has been transmitted through a transmission line having a small loss over time.

FIG. 11 is a diagram showing a differential amplitude of the equalized signal "b" with respect to data that has been transmitted through the transmission line having a small loss, together with time.

An example of the transmission line having a small loss is a short distance line.

As shown in FIG. 11, since the differential amplitude waveform intersects the zero level for the same number of times even if any one of the four values of the control signal "e" is selected, any control signal "e" may be used.

Figure 12:
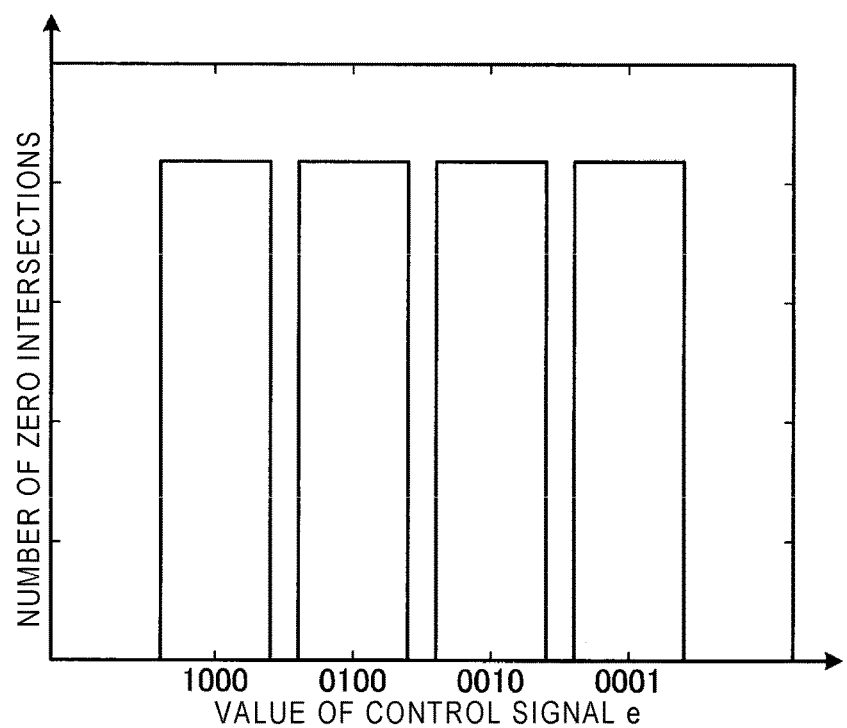
FIG. 12 is a diagram showing the number of times that a differential amplitude waveform of the equalized signal intersects a zero level within a certain period of time.

FIG. 12 is a diagram showing the number of times the differential amplitude waveform of the equalized signal "b" with respect to the data that has been transmitted through the transmission line having a small loss, as in FIG. 11, intersects the zero level within a certain period of time. FIG. 12 shows, for each of the four control signals "e", the number of zero intersections obtained with the same pattern during the same time.

In FIG. 12, the transmitted data is a training sequence in which the same bit pattern repeats every certain period of time described above. Therefore, the number of zero intersections is saturated with the number of crossings of the transmitted data regardless of the values of e. The number of crossings is the number of times 0 and 1 are exchanged in the amplitude waveform. For example, the number of crossings of data "010110" is 4.

Incidentally, the number of zero intersections being a value close to the number of crossings of the transmitted data is a necessary condition, but not a sufficient condition for existence of an eye opening. The control circuit 112 selects the characteristic corresponding to the control signal "e"="0001", which has the smallest low band attenuation amount, from the plurality of characteristics shown in FIG. 10. That is, the control circuit 112 does not select the frequency characteristic in which the low band attenuation amount with respect to a high band gain is large, and therefore it is possible to prevent an increase in a bit error due to the over equalization.

Figure 13:
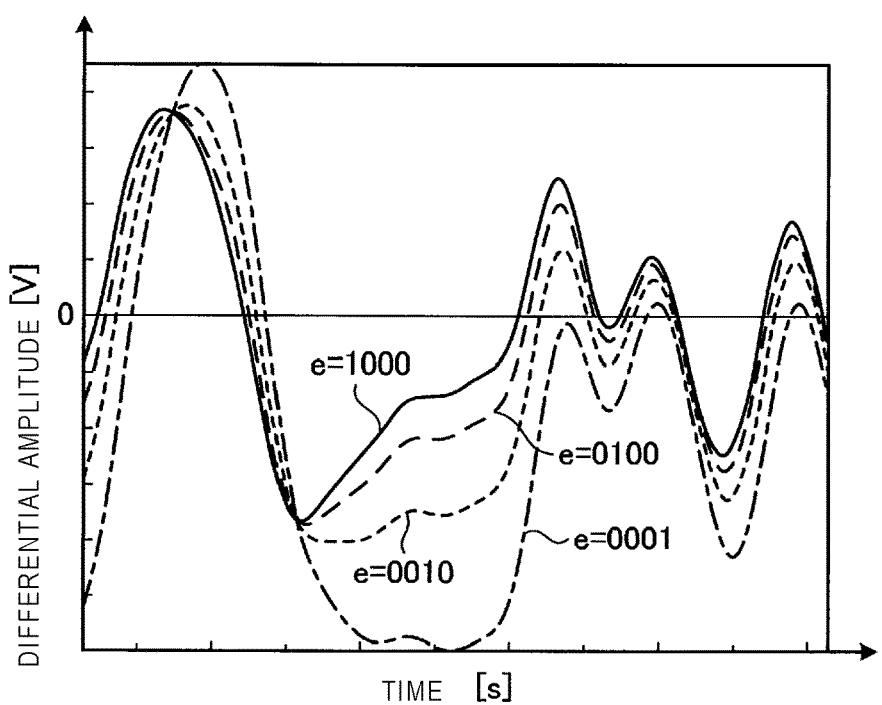
FIG. 13 is a diagram showing a differential amplitude of the equalized signal with respect to data that has been transmitted through a transmission line having a medium loss over time.

FIG. 13 is a diagram showing the differential amplitude of the equalized signal "b" with respect to data that has been transmitted through a transmission line having a medium loss, together with time.

The transmission line having a medium loss is a distance line that is longer than the short distance stated above.

As shown in FIG. 13, when e is "0001" among the four values of the control signal "e", a part of the differential amplitude waveform rises and falls within a range of negative polarity without intersecting the zero level. Although not shown in a time range of FIG. 13, even when the control signal "e" is "1000", a part of the differential amplitude waveform rises and falls within the range of negative polarity or a range of positive polarity without intersecting the zero level.

Figure 14:
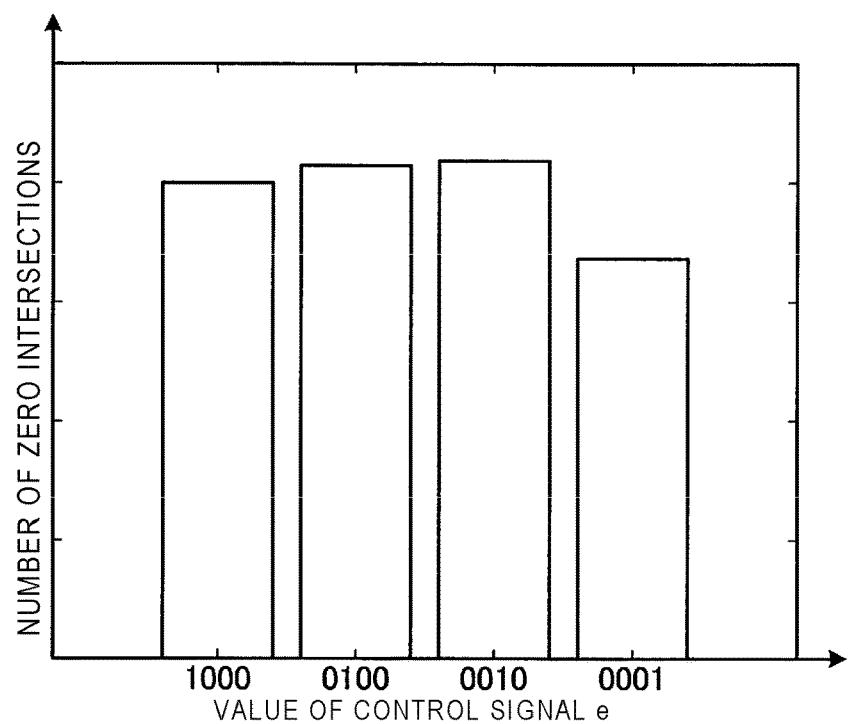
FIG. 14 is a diagram showing the number of times that a differential amplitude waveform of the equalized signal intersects the zero level within a certain period of time.

FIG. 14 is a diagram showing the number of times the differential amplitude waveform of the equalized signal "b" with respect to the data that has been transmitted through the transmission line having a medium loss, as in FIG. 12, intersects the zero level within a certain period of time. FIG. 14 shows, for each of the four values of the control signals "e", the number of zero intersections obtained with the same pattern during the same time period.

In FIG. 14, the transmitted data is the training sequence in which the same bit pattern repeats every certain period of time described above, but the number of zero intersections differs depending on the values of the control signal "e". In the example of the transmission line having a moderate attenuation, when the control signal "e" is "0001" and when the control signal "e" is "1000", the eye does not open because the number of zero intersections is less than the number of crossings of the transmitted data. In this case, the control circuit 112 selects the control signal "e"="0010" which has the smaller low band attenuation amount among the plurality of characteristics shown in FIG. 10, from "0010" and "0100 which are two values of the control signal "e" that maximize the number of zero intersections. That is, the control circuit 112 does not select the frequency characteristic in which the low band attenuation amount with respect to the high band gain is large, and therefore it is possible to prevent the increase in the bit error due to the over equalization.

Figure 15:
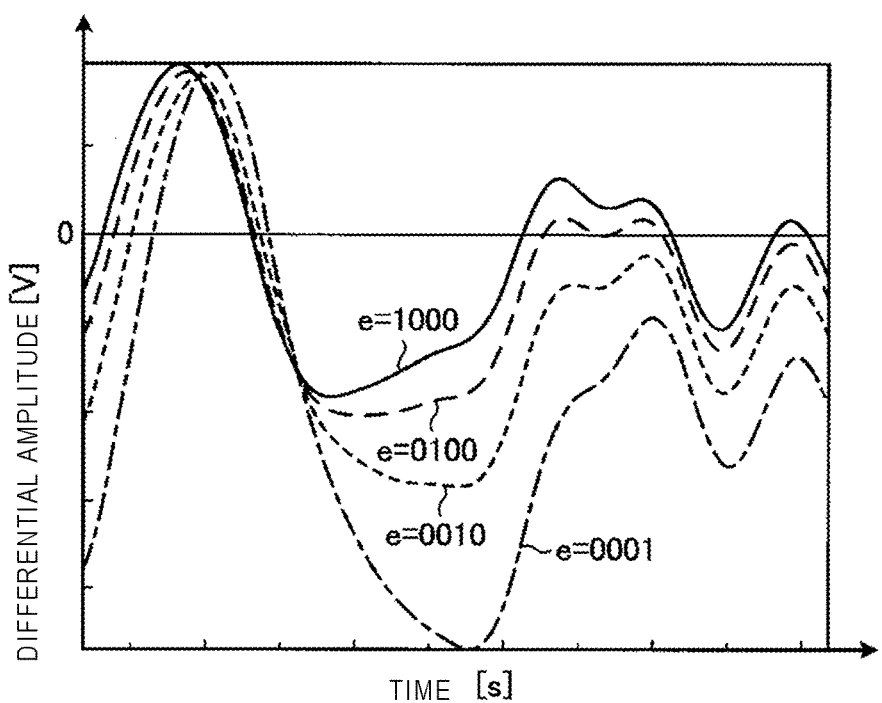
FIG. 15 is a diagram showing a differential amplitude of an output of the CTLE circuit with respect to data that has been transmitted through a transmission line having a large loss over time.

FIG. 15 is a diagram showing the differential amplitude of the output b of the CTLE circuit 101 with respect to data that has been transmitted through a transmission line having a large loss, together with time.

The transmission line having a large loss is a long distance line that is longer than the medium distance stated above.

As shown in FIG. 15, a part of the differential amplitude waveform rises and falls within the range of negative or positive polarity without intersecting the zero level even if the value of the control signal "e" is any value among the four values, and it is difficult to determine which value should be selected as the control signal "e" in this situation.

Figure 16:
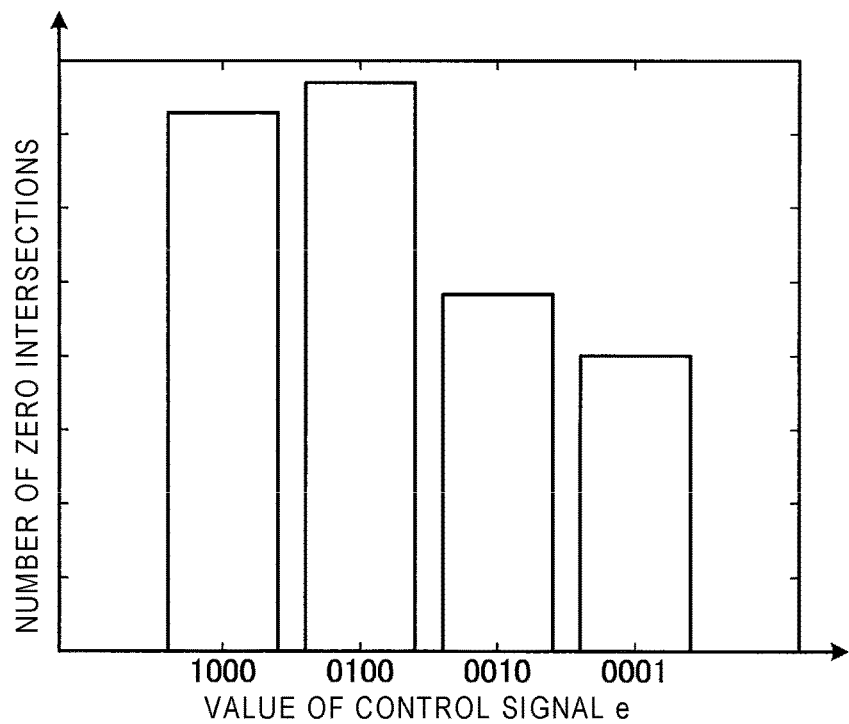
FIG. 16 is a diagram showing the number of times that a differential amplitude waveform of the equalized signal intersects the zero level within a certain period of time.

FIG. 16 is a diagram showing the number of times the differential amplitude waveform of the equalized signal "b" with respect to the data that has been transmitted through the transmission line having a large loss, as in FIG. 15, intersects the zero level within a certain period of time. FIG. 16 shows, for each of the four values of the control signals "e", the number of zero intersections obtained with the same pattern during the same time period.

In FIG. 16, the transmitted data is the training sequence in which the same bit pattern repeats every certain period of time described above, but it can be seen that the number of intersections differs depending on the values of the control signal "e".

In the example of the transmission line having a large attenuation, the eye does not open because the number of zero intersections is less than the number of crossings of the transmitted data regardless of the values of the control signal "e". In this case, the control circuit 112 selects the control signal "e"="0100" in which the maximum number of intersections is obtained among the measured number of intersections, so that a lock operation of the CDR circuit 110 and coefficient optimization of the DFE can be performed more reliably.

Figure 17:
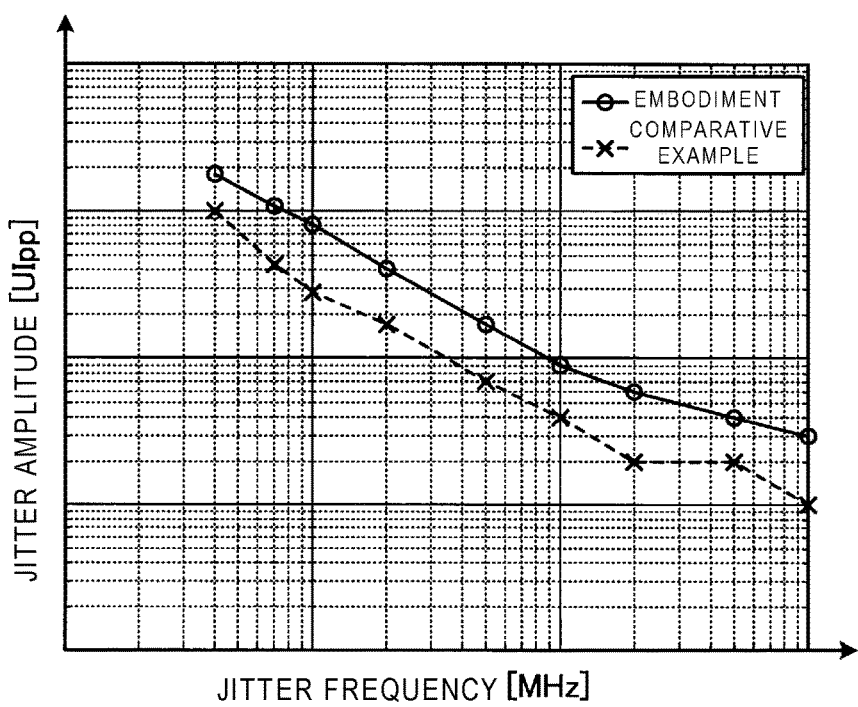
FIG. 17 is a diagram of a jitter tolerance curve when data has been transmitted through a transmission line having a large loss.

FIG. 17 shows a jitter tolerance curve when the transmission line has a large loss as shown in FIG. 15. FIG. 17 shows a result of the operations of the receiving device 100 and a result of operations of a comparative example in which these operations are not performed.

In FIG. 17, circles and a solid line show a case where the CTLE circuit 101 selects a suitable frequency characteristic in one embodiment, and crosses and a broken line show a case where the frequency characteristic of the CTLE circuit is set to have a maximum low band attenuation amount in the comparative example. According to FIG. 17, the jitter tolerance is larger in the embodiment than in the comparative example. The jitter tolerance equivalent to the present disclosure can be implemented by readjusting the frequency characteristics of the CTLE circuit even in the comparative example. However, in the comparative example, when the control signal "e"="0010" or "0001" shown in FIG. 16 is set in the receiving device from the beginning, due to a large amount of jitter, the eye opening necessary for determining necessity of the readjustment cannot be measured, and communication may be lost.

Figure 18:
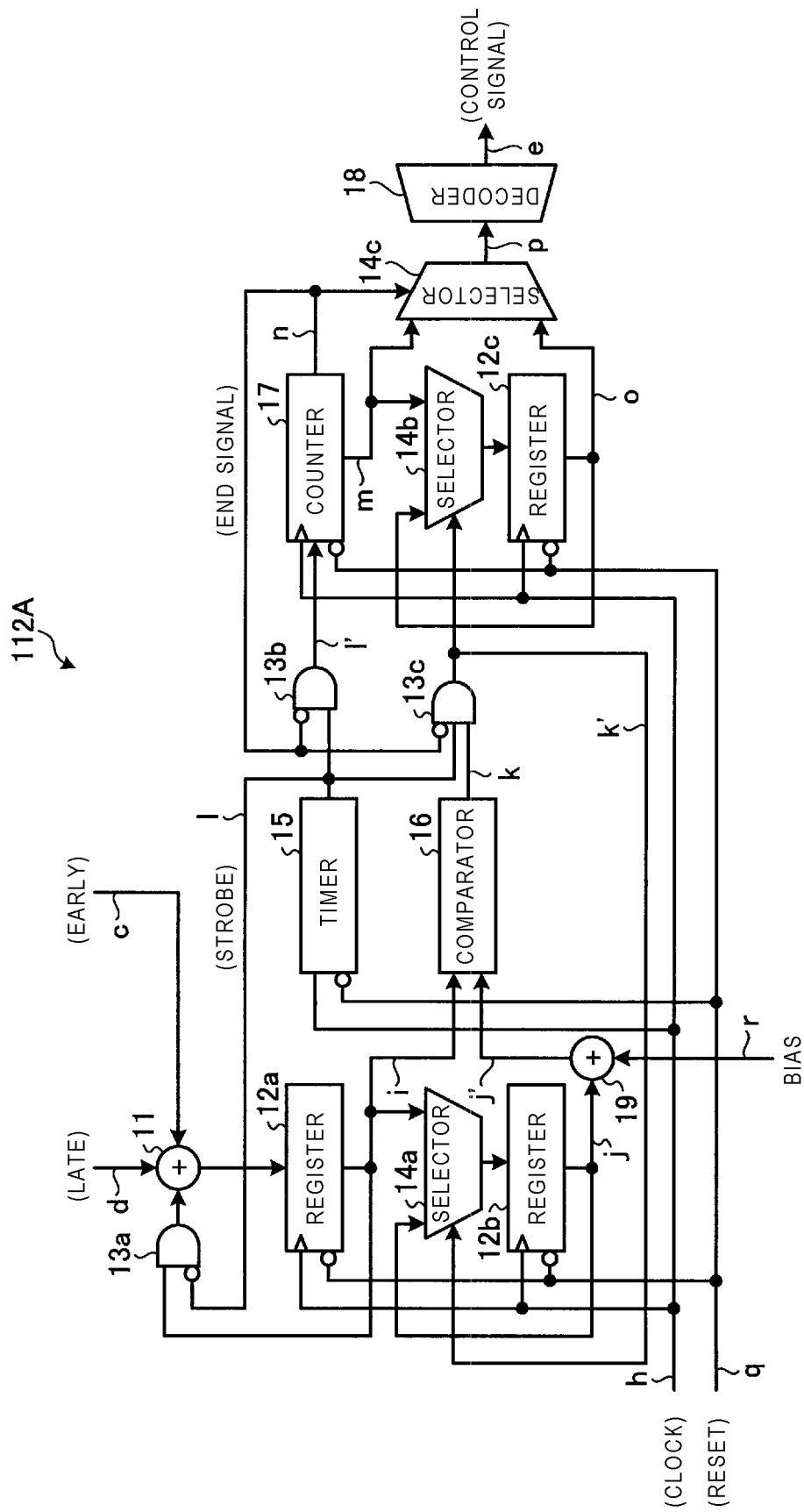
FIG. 18 is a diagram of an example of a control circuit according to a second embodiment.

FIG. 18 is a diagram of a control circuit 112A according to an embodiment.

In FIG. 18, similar parts as those of the control circuit 112 shown in FIG. 6 are designated by the same reference numerals.

The control circuit 112A is different from the control circuit 112 shown in FIG. 6 in that an adder 19 for adding a particular bias value "r" to the output signal "j" of the register 12b and outputting it to the comparator 16 is provided.

An error may occur in the measurement of the number of intersections, for example, due to frequency offset of a reference clock used in a transmitting and receiving device, spread spectrum clocking (SSC) modulation, random jitter or noise, or a part of a data pattern on a transmission side being changed every measurement cycle.

Due to this measurement error of the number of intersections, when a frequency characteristic with a higher low band attenuation amount than the frequency characteristic of the CTLE circuit 101 to be originally selected is selected, the over equalization state may be caused.

Therefore, the adder 19 is provided in a line connected to one input terminal of the comparator 16. The adder 19 is configured to supply a signal j'=j+r obtained by adding the bias value "r" to the output signal "j" of the register 12b to the comparator 16.

As a result, the comparator 16 compares the output signal "i" of the register 12a with the signal j' supplied from the adder 19, outputs signal "k"="H" level if i>j'=j+r, and outputs signal "k"="L" level if not.

In other words, when the output signal "i" of the register 12a, which is the newly measured number of intersections, is not larger than a value of the signal j' obtained by adding the bias value "r" to the output signal "j" of the register 12b, which is the maximum value among the previously measured values, the register 12b is not updated.

Therefore, by setting the bias value "r" to be equal to or greater than an expected maximum value of the measurement error of the number of intersections, it is possible to prevent the over equalization due to the measurement error of the number of intersections.

Figure 19:
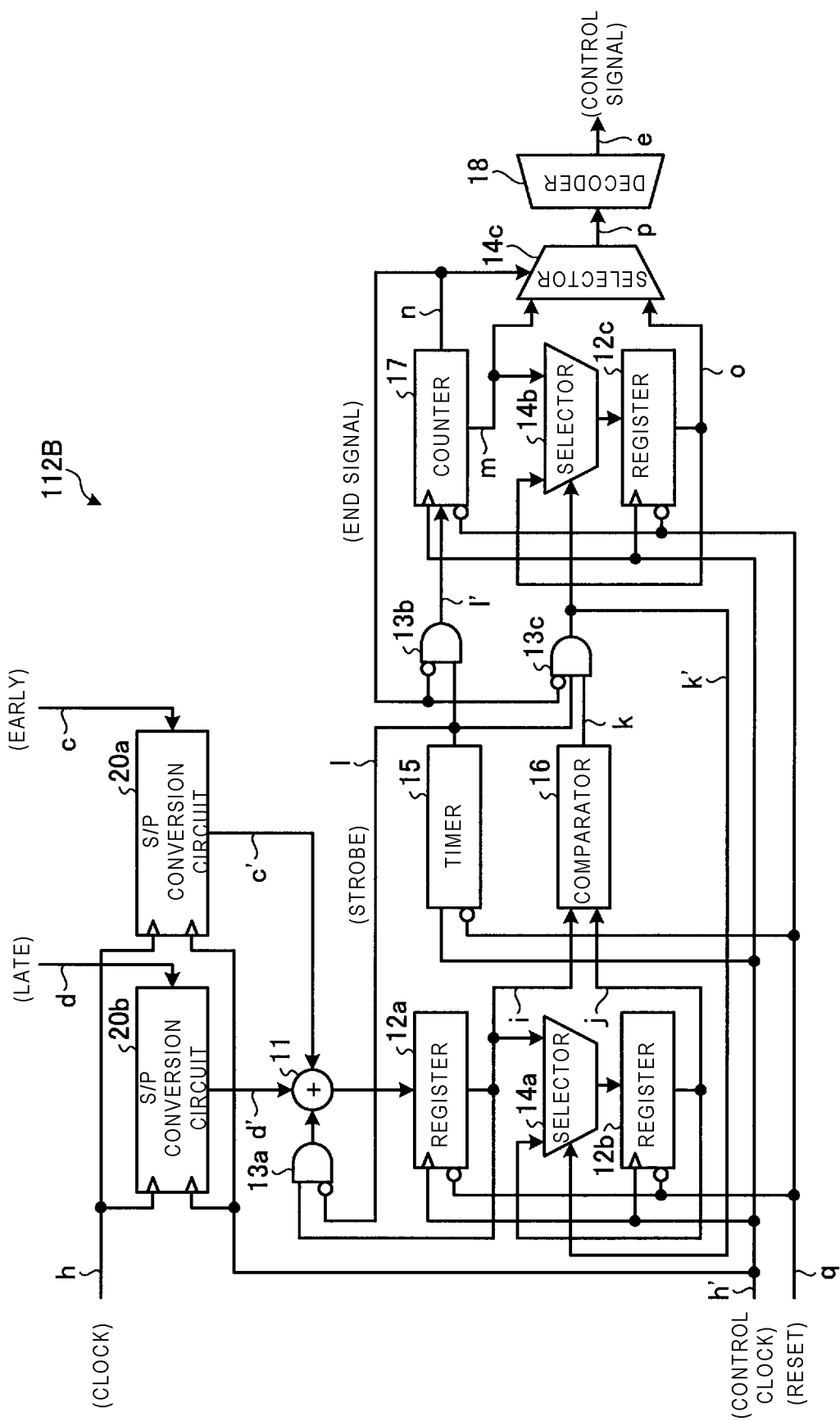
FIG. 19 is a diagram of an example of a control circuit according to a third embodiment.

FIG. 19 is a diagram of a control circuit 112B according to an embodiment.

In FIG. 19, similar parts as those of the control circuit 112 shown in FIG. 6 are designated by the same reference numerals.

Since the control circuit 112 shown in FIG. 6 has a circuit configuration more complicated than the phase comparator 111, when a communication speed is very high, it is difficult to operate the control circuit 112 with the clock h having the same frequency as that of the phase comparator 111.

Therefore, in the control circuit 112B, in order to absorb a difference in an operation speed, a serial-parallel (S/P) conversion circuit 20a and a serial-parallel (S/P) conversion circuit 20b are provided in the input of the early signal "c" and the input of the late signal "d", respectively.

Herein, the serial-parallel conversion circuits 20a and 20b use h as the clock, and use h' as a control clock. The control clock h' uses a clock obtained by dividing the clock h.

As a result, the serial-parallel conversion circuits 20a and 20b are provided between the phase comparator 111 and the adder 11 provided in the control circuit 112B, and by operating the control circuit 112B with the control clock h' having a frequency lower than that of the clock h, even when the communication speed is very high, the similar operations as those in the above-mentioned embodiments can be performed.

Figure 20:
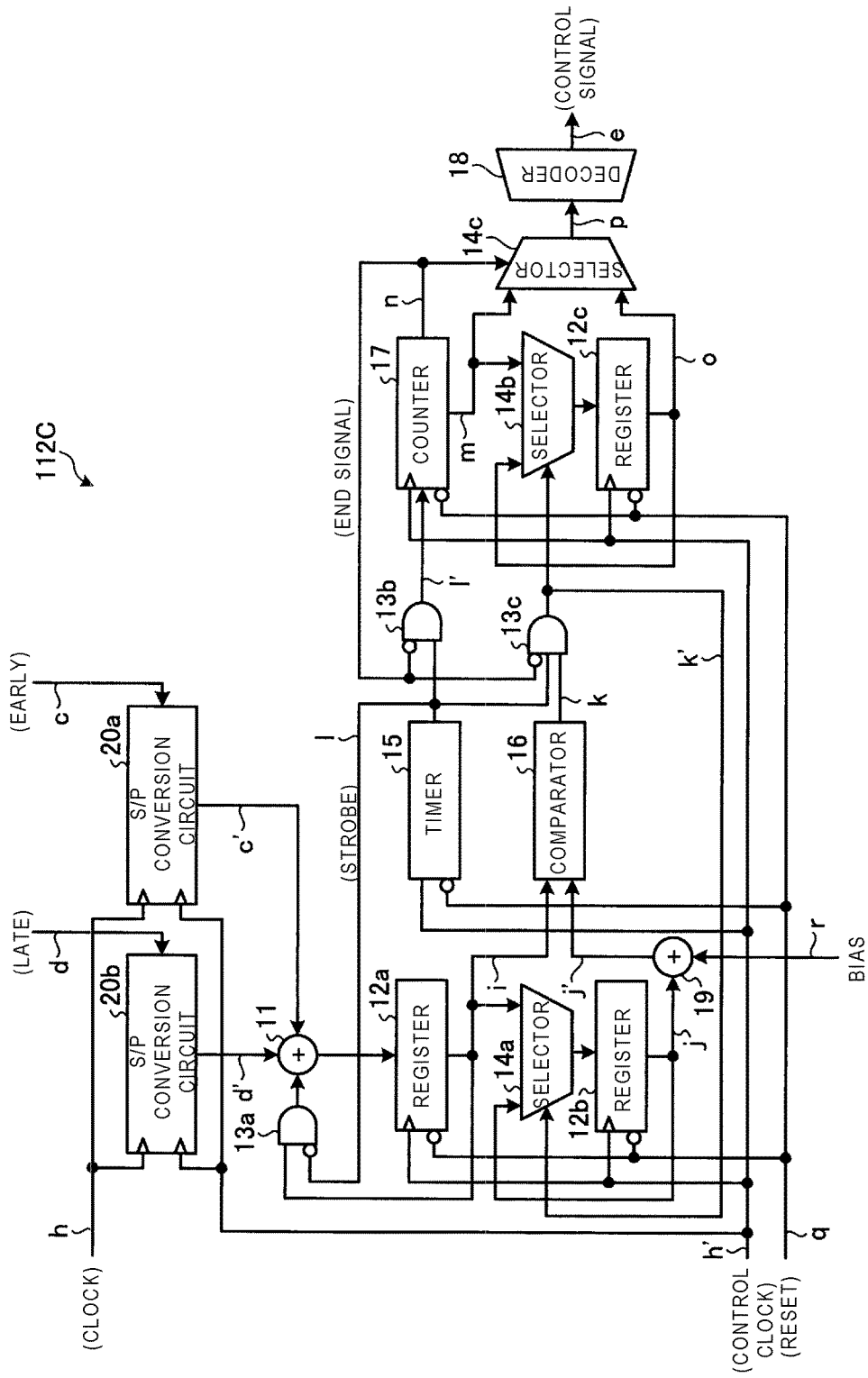
FIG. 20 is a diagram of an example of a control circuit according to a fourth embodiment.

FIG. 20 is a diagram of a control circuit 112C according to an embodiment.

In FIG. 20, similar parts as those of the control circuit 112A shown in FIG. 18 and the control circuit 112B shown in FIG. 19 are designated by the same reference numerals.

Since the control circuit 112A shown in FIG. 18 also has a circuit configuration more complicated than the phase comparator 111, when the communication speed is very high, it is difficult to operate the control circuit 112A with the clock h having the same frequency as that of the phase comparator 111.

Therefore, in the control circuit 112C, in order to absorb the difference in the operation speed, the serial-parallel (S/P) conversion circuit 20a and the serial-parallel (S/P) conversion circuit 20b are provided in the input of the early signal "c" and the input of the late signal "d", respectively.

In the example shown in FIG. 20, the control circuit 112C can operate with the control clock h' having the frequency lower than that of the clock h, and even when the communication speed is very high, the similar operations as those in the example shown in FIG. 18 can be performed.

As described above, according to the aforementioned embodiments, the frequency characteristic of the CTLE circuit 101 can be adjusted in a state in which the CDR circuit 110 is not locked, and the CDR circuit 110 can be shifted to the locked state more quickly and reliably.

It should be noted that a program executed by the equalizer control device or the receiving device may be stored in an ROM or the like in advance.

The program executed by the equalizer control device may be recorded in a computer-readable recording medium such as an optical recording medium such as a digital versatile disk (DVD) or a semiconductor memory device such as a USB memory and a solid state drive (SSD) in an installable or executable form of a file.

The program executed by the equalizer control device may be stored in a computer connected to a network such as the Internet and downloaded via the network. The program executed by the equalizer control device may be provided or distributed via the network such as the Internet.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An equalizer control device, comprising:
    a first circuit configured to, upon receipt of a data signal that has been equalized by a continuous time linear equalizer (CTLE) circuit, output a first signal related to a first number of times a waveform of the data signal crosses a threshold value or differential signals of the data signal cross each other; and a second circuit configured to count the first number during a particular time period based on the output first signal and select one of equalization parameters to be set for the CTLE circuit based on the counted first number.

2. The equalizer control device according to claim 1, wherein the second circuit is further configured to:
set a plurality of candidate equalization parameters to the CTLE circuit and count a first number for each of the candidate equalization parameters based on the first signal that has been output from the first circuit, and
select, as the equalization parameter to be set for the CTLE circuit, one of the candidate equalization parameters corresponding to the greatest counted first number.

3. The equalizer control device according to claim 2, wherein the second circuit is further configured to, when there are two or more candidate equalization parameters corresponding to the greatest first number, select one of the candidate equalization parameters corresponding to a smallest amount of signal compensation performed by the CTLE circuit.

4. The equalizer control device according to claim 1, wherein the second circuit is further configured to:
set first and second candidate equalization parameters to the CTLE circuit and count a first number for each of the first and second candidate equalization parameters,
add a particular bias value to the first number counted for the first candidate equalization parameter, and
select, as the equalization parameter to be set for the CTLE circuit, one of the first and second candidate equalization parameters corresponding to the greater first number.

5. The equalizer control device according to claim 4, wherein the first number for the first candidate equalization parameter is counted during a first time period, and the first number for the second candidate equalization parameter is counted during a second time period following the first time period.

6. The equalizer control device according to claim 4, wherein the bias value is equal to or greater than a maximum error in counting the first number by the second circuit.

7. The equalizer control device according to claim 1, wherein the first circuit is a phase comparator.

8. The equalizer control device according to claim 1, further comprising:
a third circuit configured to generate a first clock signal based on the first signal that has been output from the first circuit and a control signal that has been output from the second circuit, and output the generated first clock signal to the first circuit.

9. The equalizer control device according to claim 8, wherein the first clock is generated further based on a second clock that has been output from a phase lock loop circuit.

10. A receiving device, comprising:
a continuous time linear equalizer (CTLE) circuit configured to equalize a data signal;
a first circuit configured to, upon receipt of the equalized data signal from the CTLE circuit, output a first signal related to a first number of times a waveform of the equalized data signal crosses a threshold value or differential signals of the equalized data signal cross each other;
a second circuit configured to count the first number during a particular time period based on the output first signal, and select one of equalization parameters to be set for the CTLE circuit based on the counted first number;
a third circuit configured to output a first clock signal; and
a fourth circuit configured to recover a second clock signal from the data signal based on the first clock signal from the third circuit and the first signal from the first circuit.

11. The receiving device according to claim 10, wherein the first circuit is a phase comparator configured to output an early signal and a late signal as the first signal, and the second circuit is configured to count the first number by adding a value represented by each of the early signal and the late signal.

12. A control method, comprising:
receiving a data signal that has been equalized by a continuous time linear equalizer (CTLE) circuit;
outputting a first signal related to a first number of times a waveform of the data signal crosses a threshold value or differential signals of the data signal cross each other;
counting the first number during a particular time period based on the output first signal; and
selecting one of equalization parameters to be set for the CTLE circuit based on the counted first number.

13. The control method according to claim 12, further comprising:
setting a plurality of candidate equalization parameters to the CTLE circuit and counting a first number for each of the candidate equalization parameters; and
selecting, as the equalization parameter to be set for the CTLE circuit, one of the candidate equalization parameters corresponding to the greatest counted first number.

14. The control method according to claim 13, wherein when there are two or more candidate equalization parameters corresponding to the greatest first number, one of the candidate equalization parameters corresponding to a smallest amount of signal compensation performed by the CTLE circuit is selected as the equalization parameter to be set for the CTLE circuit.

15. The control method according to claim 12, further comprising:
setting first and second candidate equalization parameters to the CTLE circuit and counting a first number for each of the first and second candidate equalization parameter;
adding a particular bias value to the first number counted for the first candidate equalization parameter; and
selecting, as the equalization parameter to be set for the CTLE circuit, one of the first and second candidate equalization parameters corresponding to the greater first number.

16. The control method according to claim 15, wherein the first number for the first candidate equalization parameter is counted during a first time period, and the first number for the second candidate equalization parameter is counted during a second time period following the first time period.

17. The control method according to claim 15, wherein the bias value is equal to or greater than a maximum error in counting the first number.

18. The control method according to claim 12, wherein the first signal is output by a phase comparator.

19. The control method according to claim 12, further comprising:
based on the first signal, recovering a clock signal from the data signal that has been input to the CTLE circuit.

20. The control method according to claim 19, wherein the first signal includes an early signal and late signal, and the first number is counted by adding a value represented by each of the early signal and the late signal.

* * * * *